(12) United States Patent
Ricotti et al.

(10) Patent No.: US 8,669,793 B2
(45) Date of Patent: Mar. 11, 2014

(54) DRIVING CIRCUIT FOR A CIRCUIT GENERATING AN ULTRASONIC PULSE, IN PARTICULAR AN ULTRA-SONIC TRANSDUCER, AND CORRESPONDING DRIVING METHOD

(75) Inventors: Giulio Ricotti, Broni (IT); Sandro Rossi, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/484,078

(22) Filed: May 30, 2012

(65) Prior Publication Data
US 2012/0299643 A1    Nov. 29, 2012

Related U.S. Application Data

(63) Continuation-in-part of application No. PCT/EP2010/007185, filed on Nov. 26, 2010.

(30) Foreign Application Priority Data

Nov. 30, 2009    (IT) .......................... MI2009A002106

(51) Int. Cl.
*H03B 1/00*    (2006.01)
*H03K 3/00*    (2006.01)
(52) U.S. Cl.
USPC ......................................... 327/112; 327/427
(58) Field of Classification Search
USPC .................................... 327/108, 112; 326/83
See application file for complete search history.

(56) References Cited

U.S. PATENT DOCUMENTS

| 6,060,918 | A  | * | 5/2000 | Tsuchida et al. | ............... 327/143 |
| 6,333,661 | B1 | * | 12/2001 | Ando et al. | ................... 327/313 |
| 6,774,680 | B2 | * | 8/2004 | Imagawa et al. | ................ 327/77 |
| 6,828,833 | B1 | * | 12/2004 | Guebels | ........................ 327/112 |
| 2005/0179425 | A1 | * | 8/2005 | Umemoto et al. | ............ 323/284 |

OTHER PUBLICATIONS

Shaikh-Husin, N. et al., "Pulse Coded Neural Network Implementation in VLSI," Proceedings of TENCON 2000, vol. 3:237-241, Kuala Lumpur, Sep. 24-27, 2000.

* cited by examiner

*Primary Examiner* — Quan Tra
(74) *Attorney, Agent, or Firm* — Seed IP Law Group PLLC (57) ABSTRACT

A driving circuit has output terminal connected to an ultrasonic transducer and provides an output voltage. The driving circuit includes an output transistor coupled between a voltage reference and the output terminal, a high voltage comparator coupled to said output terminal and to a threshold voltage reference), a start-up circuit controlled by a setting signal; and a switching ON/OFF circuit having an input coupled to the start-up circuit an input coupled to the comparator, and an output coupled to a control terminal of the output transistor. The start-up circuit provides an ON signal to the switching on/off circuit and the comparator provides an OFF signal to the switching on/off circuit which switches off the output transistor. The high voltage comparator generates the switching off signal in response to the output voltage reaching a desired supply voltage value which depends on the value of the first threshold voltage reference.

25 Claims, 2 Drawing Sheets

DRIVING CIRCUIT FOR A CIRCUIT GENERATING AN ULTRASONIC PULSE, IN PARTICULAR AN ULTRA-SONIC TRANSDUCER, AND CORRESPONDING DRIVING METHOD

BACKGROUND

1. Technical Field

The present disclosure relates to a driving circuit for a circuit generating an ultrasonic pulse, in particular an ultrasonic transducer.

The disclosure also relates to a corresponding driving method.

The disclosure particularly, but not exclusively, relates to an ultrasonic transducer for sonographic apparatuses able to generate ultrasonic pulses having at least one first and one second width and the following description is made with reference to this field of application for convenience of explanation only.

2. Description of the Related Art

As it is well known, sonography or ultrasonography is a diagnostic imaging technique which employs ultrasonic waves or ultrasounds and which is based on the principle of ultrasound transmission and echo reception and it is widely used in general medicine, surgery and radiology fields.

Ultrasounds being normally used are comprised between 2 and 20 MHz. The frequency is chosen by taking into account that higher frequencies have a bigger image resolution power, but penetrate less deeply into the subject under examination.

These ultrasounds are commonly generated by a piezoceramic crystal being inserted in a probe which is kept into direct contact with the skin of the subject by interposing a suitable gel (which is able to eliminate the air between the probe and the skin of the subject, thus allowing the ultrasounds to penetrate into the anatomic segment under examination). The same probe is able to receive the return or echo signal, which is suitably processed by a computer and shown onto a monitor.

In particular, ultrasounds reaching a point of change of the acoustic impedance, and thus for instance an internal organ, are partly reflected and the reflected percentage has information relating the impedance difference between the crossed tissues. It is suitable to note that, due to the big impedance difference between a bone and a tissue, sonography cannot see behind a bone, which causes a total reflection of the ultrasounds, while air or gas areas generate a "shadow", causing a partial reflection of the ultrasounds.

Time employed by an ultrasound waves to cover the going, reflection and return path is provided to the computer, which calculates the depth wherefrom the echo is come, thus locating the division surface between the crossed tissues (corresponding to a change point of the acoustic impedance and thus to the depth wherefrom the echo comes).

Substantially, a sonographer, namely a diagnostic apparatus based on ultrasound sonography, comprises three parts:
- a probe comprising at least a transducer, in particular of the ultrasonic type, which transmits and receives an ultrasound signal;
- an electronic system which drives the transducer for generating the ultrasound signal or pulse to be transmitted and receives the return echo signal of such pulse from the probe, consequently processing the received echo signal; and
- a displaying system of a corresponding sonographic imaging being processed starting from the echo signal as received from the probe.

In particular, the word "transducer" generally indicates an electric or electronic device, which converts an energy type relating to mechanical and physical quantities into electric signals. In a general way, a transducer is sometimes defined as a generic device which converts energy from one form to another, in such a way that it can be further processed by men or other apparatuses. Many transducers are both sensors and actuators. An ultrasonic transducer usually comprises a piezoelectric crystal being suitably biased in order to cause its deformation and the generation of an ultrasound signal or pulse.

Ultrasound transducers for sonographic imaging are usually driven by high voltage driving circuits or drivers which are able to generate a sinusoidal signal having a variable width being comprised between 3 and 200 Vpp and frequencies between 1 MHz and 20 MHz, this sinusoidal signal being the control signal for corresponding generators of the ultrasound pulse to be transmitted, in particular piezoelectric crystals.

Frequently, the sinusoidal signal is a bipolar one, i.e., a symmetric signal with respect to a ground reference, usually equal to 0V. This however forces the drivers to be provided with a double supply reference, in other words a dual supply.

Typically, an ultrasonic transducer transmits a high voltage pulse having a length of a few µs, and receives the echo of this pulse, which is generated by its reflection on the organs of the subject under examination, for a length of around 250 µs, and then return to the transmission of a new high voltage pulse.

Figure 1:
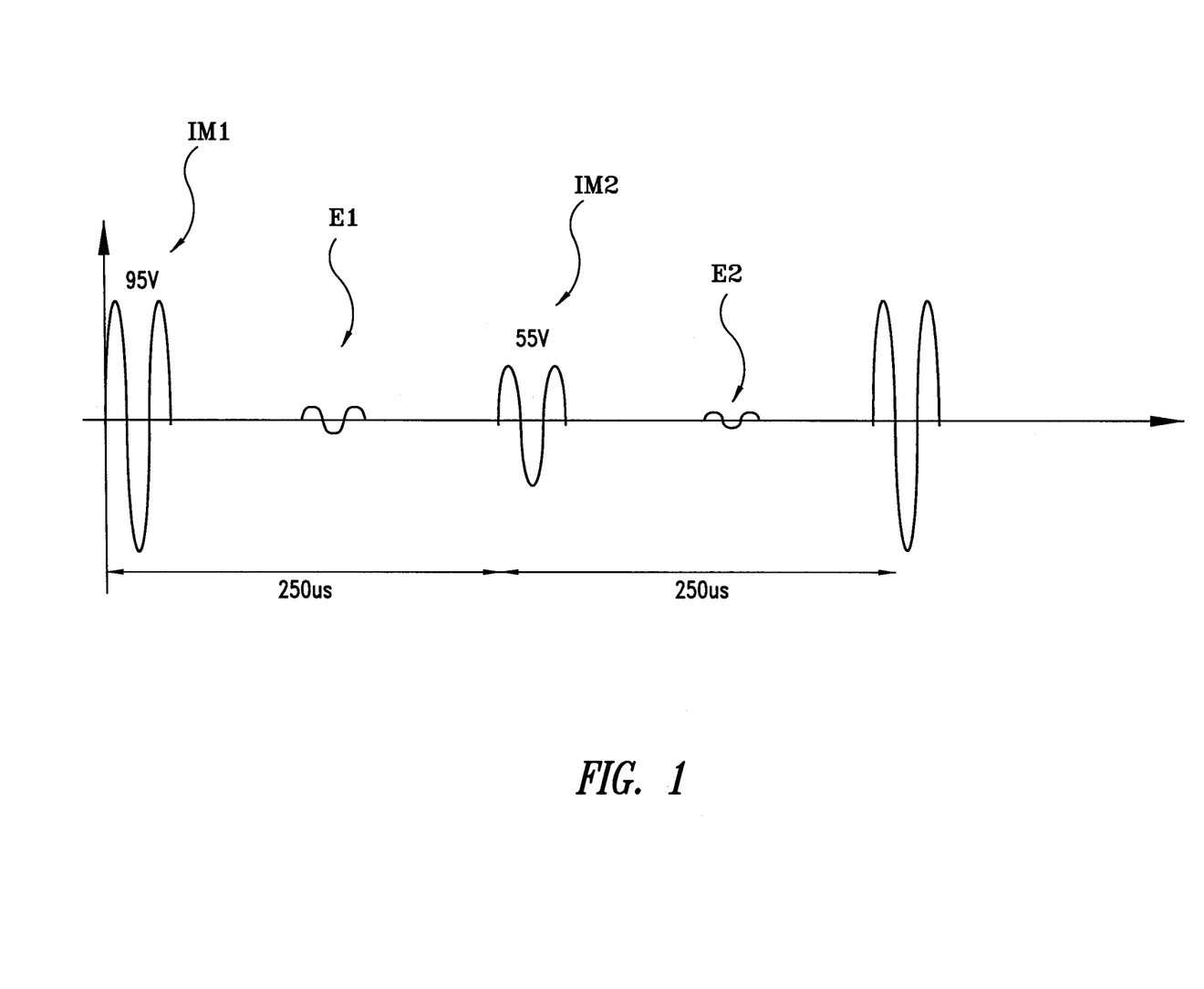
FIG. 1 schematically shows a first and a second ultrasound pulse having different widths and being used in an ultrasonic transducer.

It is also known a transmission mode of two consecutive pulses having different width in order to modulate the transmitted power. For instance, a first pulse IM1 is alternately transmitted with a second pulse IM2 having a different width, as shown in FIG. 1 by way of example. The first pulse IM1 has a peak-to-peak sweep equal to 190 Vpp, in the shown example, while the second pulse IM2 has a smaller peak-to-peak sweep, in the example equal to 110 Vpp. Moreover, the transducer receives the corresponding echoes, as shown in FIG. 1 and indicated by E1 and E2.

In particular, these first and second pulses, IM1 and IM2, are usually generated by a pulse generator such as a piezoelectric crystal, being driven by a driver which comprises a diode halfbridge being supplied with a dual voltage having an absolute value equal to the peak voltage of the generated signal.

In order to correctly generate variable width pulses, such as the pulses IM1 and IM2 of FIG. 1, it should be however possible to instantaneously change the supply voltage value for the driver between one pulse and the subsequent one, i.e., between consecutive pulses having different widths. Practically, this known solution is thus not used in view of the high power being needed to change in few tens of µs the supply voltage value, which is in particular "burdened" by the high values of the filter capacitances, being usually connected to it.

In order to try to solve this problem, it is known to generate consecutive pulses having different width by using different circuits for generating pulses or pulse circuits being driven by different drivers. Moreover, these circuits are doubled for each transducer or channel. It is in fact known to use sonographic probes having a plurality of transducers or channels, each being able to generate a pulse and to receive a corresponding reflected pulse or echo.

In particular, multiple channel apparatuses of the known type usually comprise a plurality of aligned transducers in order to allow the generation of a linear sonographic beam.

In this case, an ultrasound probe thus comprises two pulse generator circuits, independent for each transducer or channel, each being provided with corresponding driving circuits or drivers, in particular gate driving circuits or gate drivers per diode halfbridge, independent from each other and respectively supplied with two supply pairs, HVP0, HVN0 for a first driver, or halfbridge, which controls the generation of the first pulse IM1 and HVP1, HVN1 for a second driver, or halfbridge, which controls the generation of the second pulse IM2, respectively. By taking into account the example shown in FIG. 1, it is possible to use the following values for the supply voltages of the drivers of the pulse generator circuits or halfbridges:

HVP0=+95V, HVN0=−95V,
HVP1=+55V, HVN1=−55V.

It is immediate to understand that this known solution has a high cost due to the increase of the area and of the circuit complexity of the driving circuit or driver of the ultrasonic transducer having variable width pulses.

This increase of the area and circuit complexity turns out to be unacceptable in case of generation of 3D sonographic imaging, which uses probes comprising transducers or channel matrices, in particular up to 2500/3000 shifted channels, being able to focus the sonographic signal to provide a 3D imaging.

BRIEF SUMMARY

One embodiment is a driving circuit for ultrasonic transducers having structural and functional features which allow to avoid a duplication of the circuitry connected to each transducer and thus overcoming the limits which still affect the driving circuits realized according to the prior art.

One embodiment is a driving circuit with at least one first and one second comparator for each channel or ultrasonic transducer to be driven, in particular for a positive supply portion or positive branch and for a negative supply portion or negative branch of the driving circuit, respectively, able to provide an output voltage value which varies from a first value to a second value, respectively high and low, by using threshold voltage lines being independent from the supply voltage references and thus being not affected by the problems tied to the filter capacitances.

One embodiment is a driving circuit having at least one output terminal connected to an ultrasonic pulse generator circuit and providing thereto with an output voltage, a first portion connected to a first voltage reference and including at least one first output transistor being inserted between said first voltage reference and said output terminal. The first portion further includes:

at least one first high voltage comparator being connected to said output terminal and to a first threshold voltage reference, at least one first start-up circuit being controlled by a first setting signal;

at least one first switching on/off circuit being connected at its input to said first start-up circuit, in correspondence with a first internal circuit node, and to said first high voltage comparator, in correspondence with a second internal circuit node, and at its output to a control terminal of said first output transistor;

said first start-up circuit providing a switching on signal to said first switching on/off circuit while said high voltage comparator provides a switching off signal to said first switching on/off circuit which causes the switching off of said output transistor, said high voltage comparator generating said switching off signal when said output voltage reaches a first desired supply voltage value which depends on the value of said first threshold voltage reference.

More in particular, the disclosure comprises the following additional and optional features, when taken alone or in combination to one another, if any.

According to an aspect of the present disclosure, said first high voltage comparator could comprise at least one transistor, being inserted between said second internal circuit node and said first threshold voltage reference and having a control terminal being connected to a third internal circuit node, being in turn connected, by means of a diode to said output terminal, said diode providing the control terminal of the transistor with a switching on signal being correlated with the value of said output voltage at said output terminal.

According to this aspect of the present disclosure, said first high voltage comparator could further comprise a resistor and a Zener diode being inserted, in parallel one another, between said third internal circuit node and said first threshold voltage reference.

Furthermore, according to an aspect of the present disclosure, said first start-up circuit could comprise at least one input transistor being inserted between said first internal circuit node and a further voltage reference and having a control terminal which receives said first setting signal, said input transistor providing said first internal circuit node with said switching on signal.

According to this aspect of the present disclosure, said first start-up circuit could further comprise a first resistor and a first diode being inserted, in series one another, between said first voltage reference and a first reference voltage reference and being interconnected in correspondence with said first internal circuit node.

According to yet another aspect of the present disclosure, said first switching on/off circuit could comprise at least one flip-flop being inserted between said first voltage reference and said first reference voltage reference and having a first input terminal being connected to said first internal circuit node and a second input terminal being connected to said second internal circuit node, as well as an output terminal being connected to an input terminal of a buffer, being in turn inserted between said first voltage reference and said first reference voltage reference, said buffer having an output terminal being connected to said control terminal of said first output transistor whereto it provides a control signal.

According to this aspect of the present disclosure, said first switching on/off circuit could further comprise a second resistor and a second diode being inserted, in series one another, between said voltage reference and said first reference voltage reference and being interconnected in correspondence with said second internal circuit node whereto they provide said switching off signal.

Furthermore, according to another aspect of the present disclosure, said first threshold voltage reference is brought between a first and a second threshold value, which correspond to a first and a second supply voltage value being desired for said output voltage.

According to yet another aspect of the present disclosure, said driving circuit could comprise at least one second portion being connected to a second voltage reference and including at least one second output transistor being inserted between said output terminal and said second voltage reference, said second portion being configured in a similar manner than said first portion and comprising at least one second high voltage comparator, a second start-up circuit and a second switching on/off circuit, as well as respective second output transistor and second input transistor.

According to a further aspect of the present disclosure, said first output and input transistors are high voltage P-channel MOS transistors and said second output and input transistors are high voltage N-channel MOS transistors.

According to another aspect of the present disclosure, said transistors of said first and second high voltage comparators are high voltage transistors.

Furthermore, according to an aspect of the present disclosure, said generator circuit is an ultrasonic transducer for generating ultrasonic pulses having at least one first and one second width.

One embodiment is a method for generating a desired supply voltage value to be applied to a load by means of a driving circuit having at least one output terminal connected to said load. The method includes:

providing at least one voltage reference being connected to said output terminal thought at least one output transistor being connected to a voltage reference;
 raising up an output voltage level of said output terminal by switching on said output transistor; and
 cutting off said step of raising up said output voltage level when the same has reached said desired supply voltage value.

The cutting off is started up by the switching of a comparator being connected to said output terminal and to a threshold voltage reference, being independent from said voltage reference.

According to an aspect of the present disclosure, said step of cutting off could use a comparator which comprises at least one transistor and in that said threshold voltage reference is chosen in such a way to cause the switching on of said transistor when said output voltage reaches said desired supply voltage value.

According to another aspect of the present disclosure, said step of cutting off could use a threshold voltage reference being correlated to said desired supply voltage value of said output terminal.

Furthermore, according to an aspect of the present disclosure, said method could comprise a step of varying said threshold voltage reference which is brought between a first and a second threshold value, which correspond to a first and to a second desired supply voltage value.

According to another aspect of the present disclosure, said load is an ultrasonic transducer for generating ultrasound pulses.

According to yet another aspect of the present disclosure, said ultrasonic pulses have at least one first and one second width.

Finally, according to a further aspect of the present disclosure, said method could use a driving circuit being realized as above indicated.

The features and advantages of the driving circuit and of the method according to the disclosure will be apparent from the following description of an embodiment thereof given by way of indicative and non-limiting example with reference to the annexed drawings.

DETAILED DESCRIPTION

Figure 2:
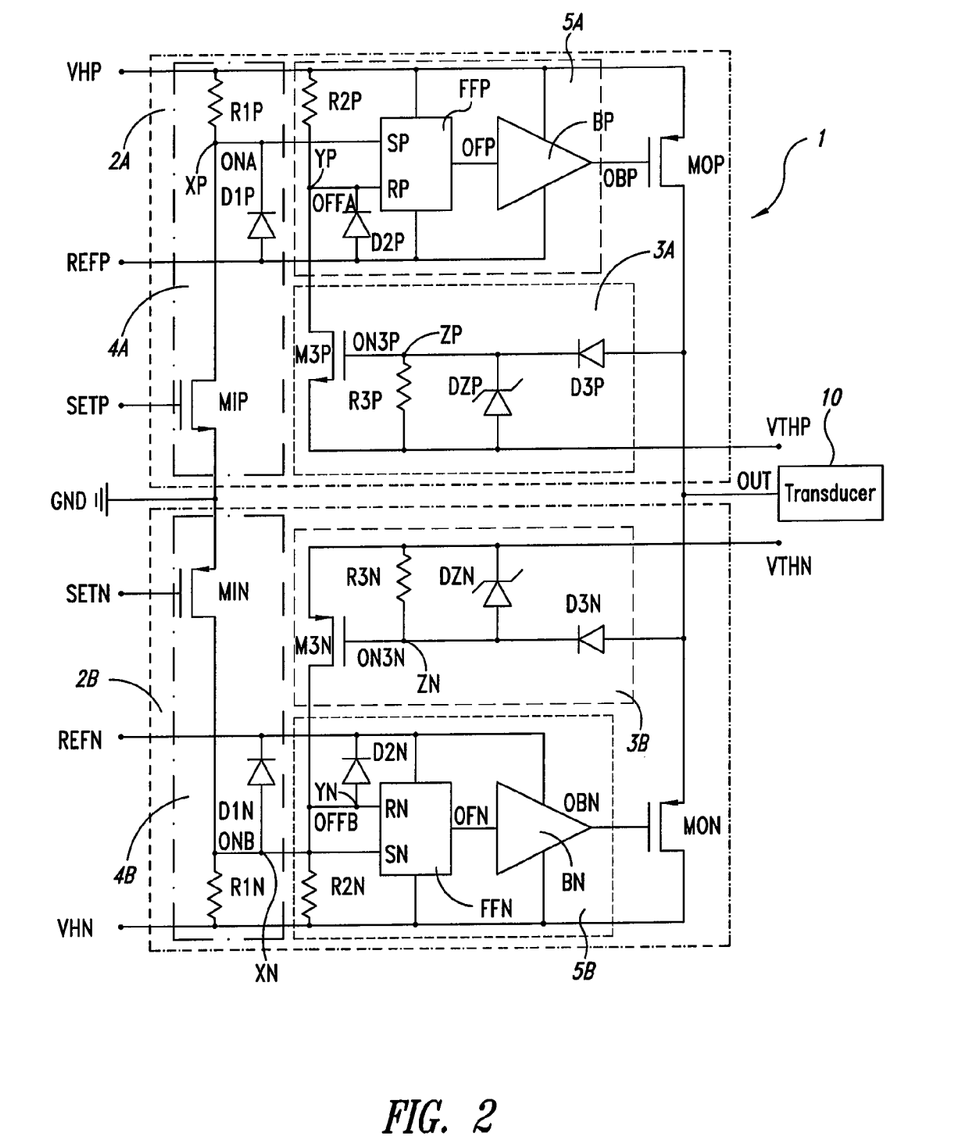
FIG. 2 schematically shows a driving circuit for an ultrasonic transducer being realized according to the disclosure.

With reference to these figures, and in particular to FIG. 2, a driving circuit, in particular for an ultrasound transducer, being realized according to the disclosure is schematically and globally indicated by 1.

This driving circuit 1 comprises at least one first portion 2A having a terminal connected to a first high voltage reference, or positive high voltage reference VHP, and at least one second portion 2B having a terminal connected to a second high voltage reference, or negative high voltage reference VHN. In the following description, these first and second portions 2A and 2B will be also simply indicated as positive branch 2A and negative branch 2B of the driving circuit 1.

The positive branch 2A and the negative branch 2B are connected to the output terminal OUT of the driving circuit 1.

Advantageously, the positive branch 2A and the negative branch 2B of the driving circuit 1 comprise respective high voltage comparators, in particular a first comparator 3A and a second comparator 3B. Further advantageously, the first comparator 3A and the second comparator 3B have respective terminals connected to respective first and second threshold voltage references, positive VTHP and negative VTHN. In particular, the first positive threshold voltage reference VTHP has a value which is comprised between zero and the positive high voltage reference VHP, while the negative threshold voltage reference VTHN has a value which is comprised between zero and the negative high voltage reference VHN.

In particular, these threshold voltage references are chosen in such a way that the comparators 3A and 3B switch when the output terminal OUT reaches a desired output voltage value Vout, as will be clarified in the following description.

More in detail, the positive branch 2A of the driving circuit 1 is coupled between the positive high voltage reference VHP and a further voltage reference, in particular a ground GND and it is connected to an output terminal OUT of the driving circuit 1 itself. The output terminal OUT of the driving circuit 1 is thus connected to an ultrasonic transducer 10, that is, a generator of an ultrasonic signal or pulse, in particular a piezoelectric crystal.

This positive branch 2A comprises a first resistor R1P and a first diode D1P coupled between the positive high voltage reference VHP and a first reference voltage reference REFP and interconnected at a first internal circuit node XP.

Here and in the following description, for sake of simplicity and to not burden text and drawings, same alphanumeric references will be used to indicate references and circuital nodes and the voltage signals being thereon.

Furthermore, the positive branch 2A comprises a second resistor R2P and a second diode D2P coupled between the positive high voltage reference VHP and the first reference voltage reference REFP and interconnected at a second internal circuit node YP.

The positive branch 2A further comprises a flip-flop FFP being inserted between the positive high voltage reference VHP and the first reference voltage reference REFP and having a first input terminal or set terminal SP being connected to the first internal circuit node XP and a second input terminal or reset terminal RP being connected to the second internal circuit node YP. In such a way, the first resistor R1P and the first diode D1P provide the first internal circuit node XP with a set signal which corresponds to a switching on signal ONA of the positive branch 2A of the driving circuit 1, and the second resistor R2P and the second diode D2P provide the second internal circuit node YP with a reset signal which corresponds to a switching off signal OFFA of the positive branch 2A of the driving circuit 1, as will be clarified in the following description.

The flip-flop FFP further has an output terminal OFP being connected to an input terminal of a buffer BP, being in turn comprised within the positive branch 2A and inserted between the first high voltage reference VHP and the first reference voltage reference REFP. In this way, the flip-flop FFP provides the buffer with a result signal OFP.

The buffer BP has in turn an output terminal OBP being connected to a control terminal, in particular a gate terminal of a first output transistor MOP, in particular, in the example shown in FIG. 2, a P-channel high voltage MOS transistor, being in turn inserted between the first high voltage reference VHP and the output terminal OUT of the driving circuit 1. The buffer BP thus provides the gate terminal of the first output transistor MOP with a control signal OBP.

The positive branch 2A further includes a first input transistor MIP, in particular, in the example shown in FIG. 2, an N-channel high voltage MOS transistor, being inserted between the first internal circuit node XP and ground GND and having a control terminal, in particular a gate terminal which receives a first setting signal SETP.

Advantageously, the positive branch 2A further comprises the first high voltage comparator 3A coupled between the second internal circuit node YP and the first positive threshold voltage reference VTHP. The first comparator 3A is also connected to an output terminal OUT of the driving circuit 1.

More in particular, the first comparator 3A comprises a transistor M3P, in particular, in the example shown in FIG. 2, an N-channel high voltage MOS transistor, being inserted between the second internal circuit node YP and the first positive threshold voltage reference VTHP and having a control terminal, in particular a gate terminal being connected to a third internal circuit node ZP.

The first comparator 3A further comprises a third resistor R3P and a Zener diode DZP coupled, in parallel to each other, between the third internal circuit node ZP and the first positive threshold voltage reference VTHP, as well as a third diode D3P coupled between the third internal circuit node ZP and the output terminal OUT of the driving circuit 1. In this way, the third diode D3P provides the gate terminal of the transistor M3P with a switching on signal ON3P correlated to the output voltage value Vout on the output terminal OUT.

In particular, the first positive threshold voltage reference VTHP is chosen in such a way to cause the switching on of the transistor M3P when the output voltage Vout at the output terminal OUT of the driving circuit 1 reaches a desired voltage value. The value of this first positive threshold voltage reference VTHP is thus correlated to the desired supply value for the output terminal OUT and is between a first and a second threshold value, which respectively correspond to first and second supply voltage values for enabling the ultrasonic transducer 10 to generate a first and a second pulse of different widths.

Advantageously, the first resistor R1P, the first diode D1P and the first input transistor MIP realize a first start-up circuit 4A of the positive branch 2A of the driving circuit 1, in particular of the first output transistor MOP, while the second resistor R2P, the second diode D2P, the flip-flop FFP and the buffer BP realize a first switching on/off circuit 5A of the positive branch 2A of the driving circuit 1, in particular of the first output transistor MOP.

More in particular, the first start-up circuit 4A is driven by the first setting signal SETP, while the first switching on/off circuit 5A is driven by the switching on signal ONA being provided by the first start-up circuit 4A on the first internal circuit node XP and the switching off signal OFFA being provided by the first comparator 3A on the second internal circuit node YP.

More in particular, the switching on signal ONA is generated by the first input transistor MIP based on the first setting signal SETP while the switching off signal OFFA is generated by the first comparator 3A based on the comparison between the output voltage Vout and the first positive threshold voltage reference VTHP when it verifies that this output voltage Vout reaches a first desired supply voltage value, in particular a positive supply.

In a completely similar manner, the negative branch 2B is inserted between the ground GND and the negative high voltage reference VHN and it is connected to the output terminal OUT of the driving circuit 1. The negative branch 2B advantageously has a structure being fully similar to the positive branch 2A, the corresponding elements being distinguished from the ones of the positive branch 2A by the final letter N substituting the final letter P which identifies the elements of the positive branch 2A.

In particular, this negative branch 2B comprises a first diode D1N and a first resistor R1N coupled between a second reference voltage reference REFN and the negative high voltage reference VHN and interconnected at a first internal circuit node XN, as well as a second diode D2N and a second resistor R2N coupled between the second reference voltage reference REFN and the negative high voltage reference VHN and interconnected at a second internal circuit node YN.

The negative branch 2B also comprises a flip-flop FFN coupled between a second reference voltage reference REFN and the negative high voltage reference VHN and having a first input terminal or set terminal SN being connected to the first internal circuit node XN and a second input terminal or reset terminal RN being connected to the second internal circuit node YN. In this way, the first resistor R1N and the first diode D1N provide the first internal circuit node XN with a set signal corresponding to a switching on signal ONB of the negative branch 2B of the driving circuit 1, while the second resistor R2N and the second diode D2N provide the second internal circuit node YN with a reset signal corresponding to a switching off signal OFFB of the negative branch 2B of the driving circuit 1.

The flip-flop FFN further has an output terminal OFN connected to an input terminal of a buffer BN, still comprised within the negative branch 2B and in turn inserted between the second reference voltage reference REFN and the negative high voltage reference VHN. In this way, the flip-flop FFP provides the buffer with a result signal OFN.

The buffer BN in turn has an output terminal OBN being connected to a control terminal, in particular a gate terminal of a second output transistor MON, in particular, in the example shown in FIG. 2, an N-channel high voltage MOS transistor, in turn inserted between the output terminal OUT of the driving circuit 1 and the negative high voltage reference VHN. The buffer BN thus provides the gate terminal of the second output transistor MON with a control signal OBN.

The negative branch 2B further includes a second input transistor MIN, in particular, in the example shown in FIG. 2, a P-channel high voltage MOS transistor, being inserted between ground GND and the first internal circuit node XN and having a control terminal, in particular a gate terminal, which receives a second setting signal SETN.

Advantageously according to the disclosure, the negative branch 2B comprises the second high voltage comparator 3B coupled between the second negative threshold voltage reference VTHN and the second internal circuit node YN. Moreover, the second comparator 3B is also connected to the output terminal OUT of the driving circuit 1.

More in particular, the second comparator 3B comprises a transistor M3N, in particular, in the example shown in FIG. 2, a P-channel high voltage MOS transistor, coupled between the second negative threshold voltage reference VTHN and the second internal circuit node YN and having a control terminal, in particular a gate terminal being connected to a third internal circuit node ZN.

The second comparator 3B further comprises a third resistor R3N and a Zener diode DZN coupled, in parallel to each other, between the second negative threshold voltage reference VTHN and the third internal circuit node ZN, as well as a third diode D3N coupled between the third internal circuit node ZN and the output terminal OUT of the driving circuit 1. In this way, the third diode D3N provides the gate terminal of the transistor M3P with a switching on signal ON3N being correlated with the output voltage value Vout on the output terminal OUT.

In particular, advantageously according to the disclosure, the first comparator 3A and the second comparator 3B are programmable high voltage comparators, of the fully passive type, i.e., without a static biasing current consumption.

In fact, these first comparator 3A and second comparator 3B are realized by means of a single MOS transistor, M3P and M3N respectively, which, while being of the high voltage type, could advantageously be sized as small as possible. This transistor is also off for the large part of the working time of the driving circuit 1, as will be well clarified in the following description, by limiting in this way the consumption of the corresponding comparator.

Advantageously according to the disclosure, the first resistor R1N, the first diode D1N and the second input transistor MIN realize a second start-up circuit 4B of the negative branch 2B of the driving circuit 1, in particular of the second output transistor MON, while the second resistor R2N, the second diode D2N, the flip-flop FFN and the buffer BN realize a second switching on/off circuit 5B of the negative branch 2B of the driving circuit 1, in particular of the second output transistor MON.

In particular, the second start-up circuit 4B is driven by the second setting signal SETN, while the second switching on/off circuit 5B is driven by the switching on signal ONB being provided by the second start-up circuit 4B on the first internal circuit node XN and by the switching off signal OFFB being provided by the second comparator 3B on the second internal circuit node YN.

More in particular, the switching on signal ONB is generated by the second input transistor MIN based on the second setting signal SETN while the switching off signal OFFB is generated by the second comparator 3B based on the comparison between the output voltage Vout and the second negative threshold voltage reference VTHN when it verifies that this output voltage Vout has reached a second desired supply voltage value, in particular a negative supply.

It is suitable to note that the value which has been chosen for the first reference voltage reference REFP corresponds to a voltage value able to completely switch on the first output transistor MOP and it is equal to the value of the positive high voltage reference VHP diminished to a voltage value equal to the maximum gate-source voltage which is applicable to this first output transistor MOP. Analogously, the second reference voltage reference REFN corresponds to a voltage value being able to completely switch on the second output transistor MON and equal to the value of the negative high voltage reference VNH being augmented to a voltage value equal to the maximum gate-source voltage being applicable to this second output transistor MON.

In order to better understand the working of the driving circuit 1, it is suitable to underline the fact that the load to be driven, i.e., an ultrasonic transducer 10, being usually realized by a piezoelectric crystal, in DC works as a capacitor. In particular, this means that, if the driving circuit 1 provides it with an output voltage value Vout and then configures itself in a tri-state condition, on the load, i.e., on the ultrasonic transducer, this output voltage value Vout remains for a long time with respect to the time constants being typical of the ultrasonic transducer itself. In fact, this output voltage value Vout turns out to uniquely depend from the leakage resistances in parallel to the ultrasonic transducer and from the leakage currents.

It is also to be underlined that monitoring the output voltage value Vout being instantaneously taken by the output terminal OUT of the driving circuit 1 (corresponding to a voltage value across the ultrasonic transducer being applied thereto as a load), realized by the comparators 3A and 3B, theoretically can be simply made by means of a resistive voltage divider which lowers the value within the supply range of the CMOS components, in order to realize in this way a low voltage comparator. Practically however such a solution, which has the advantage of using a low voltage comparator, cannot be realized due to the power consumption which has been introduced by the resistive voltage divider, consumption that turns out to be multiplied over the usually used 2000 or 3000 channels, besides a multiplicative factor equal to 2 being added by the positive and negative branches to be considered.

Advantageously, the comparators 3A and 3B being comprised within the positive 2A and negative 2B branches of the driving circuit 1, respectively, are connected to a single high voltage reference, positive VHP and negative VHN, and to respective threshold voltage references, VTHP and VTHN. In particular, these lines of threshold voltage are "light" to be moved, being not burden by the filter condensers which are connected to the supply references.

Let's now see the working of the driving circuit 1. For sake of simplicity, the positive branch 2A will be taken into account, analogous considerations applying to the negative branch 2B.

A suitable first setting signal SETP being applied to the control terminal of the first input transistor MIP causes its switching on, with a subsequent raising up of the signal on the first internal circuit node XP and thus on the set terminal SP of the flip-flop FFP, which in its turn, by means of the buffer BP, switches on the first output transistor MOP.

The output voltage Vout on the output terminal OUT of the driving circuit 1 begins thus to raise up.

This output voltage Vout is compared by the first high voltage comparator 3A with the first positive threshold voltage reference VTHP in such a way that the transistor MP3 of the first comparator 3A is switched on when this output voltage Vout overcomes a first supply voltage value for generating a first pulse on the transducer 10 connected to the output terminal OUT. The transistor M3P, acting on the second internal circuit node YP and thus on the reset terminal RP of the flip-flop FFP and on the buffer BP, due to the switching off of the first output transistor MOP.

In this way, the output voltage Vout on the output terminal OUT of the driving circuit 1 is fixed to the first supply voltage value.

Advantageously, by modifying the voltage value of this first positive threshold voltage reference VTHP, which is, as already said, a line being easy to be modified since it is not filtered, it is possible to vary the output voltage value Vout on the output terminal OUT and thus the voltage value being provided to the ultrasonic transducer.

As already explained, the value of the first positive threshold voltage reference VTHP is thus correlated to the desired supply value for the output terminal OUT and it is advantageously brought between a first and a second threshold value, corresponding to a first and to a second supply voltage value for generating a first and a second pulse of different widths.

In a preferred embodiment of the driving circuit 1, thanks to a suitable sizing of the high voltage comparator components, and in particular of the transistors comprised therein, the threshold voltage value is equal to 55V or 95V (positive or negative) for generating a first and a second ultrasound pulse having different widths and in particular equal to 5.5 and to 9.5V.

Analogously, it is possible to obtain a first and a second negative voltage value on the output terminal OUT by switching on the negative branch 2B by a second setting signal SETN being applied to the control terminal of the second input transistor MIN and the subsequent switching on of the second output transistor MON. The switching off of the second output transistor MON is also caused by the signal OFFB coming from the second comparator 3B.

The present disclosure thus also refers to a method for generating a desired supply voltage value to be applied to the load, in particular an ultrasonic transducer, such as for example a piezoelectric crystal, for generating ultrasound pulses, in particular of different widths, by using a driving circuit 1 having at least one output terminal OUT being connected to said load.

In particular, the method according to the disclosure comprises the steps of:
  providing at least one high voltage reference being connected to the output terminal OUT thought an output transistor MOP being connected to a high voltage reference VPH;
  raising up an output voltage level Vout of this output terminal OUT by switching on this output transistor MOP; and
  cutting off the step of raising up the output voltage level Vout when the same has reached this desired supply voltage value.

Advantageously according to the disclosure, the step of cutting off is started up by the switching of a comparator being connected to the output terminal OUT and to a threshold voltage reference, being independent from the high voltage reference.

In particular, the comparator comprises at least one transistor and the threshold voltage reference is chosen in such a way to cause the switching on of this transistor when the output voltage Vout on the output terminal OUT reaches a desired supply voltage value.

Further advantageously according to the disclosure, the value of this threshold voltage reference is correlated to the desired supply value for the output terminal OUT and is advantageously brought between a first and a second threshold value, corresponding to a first and to a second supply voltage value for the generation by the transducer, connected to the output terminal OUT of a first and a second pulse of different widths.

Advantageously according to the disclosure, a driving circuit is thus realized as being adapted to be used for a channel or ultrasonic transducer and able to provide a variable output voltage value from a first value to a second value, respectively high and low, by using threshold voltage lines being independent from the supply high voltage references and thus do not affected by the problems tied to the corresponding filter capacitances.

Substantially, the driving circuit 1 according to the disclosure uses two comparators for each channel, in particular one for the positive branch and one for the negative one, being fully passive and receiving at the input a threshold voltage value, not a low voltage (i.e., within the CMOS range), but raised up to the same dynamic of the output signal.

Advantageously according to the disclosure, these comparators, which should be multiplied by the number of channels of the ultrasonic transducer, are simply made by a MOS transistor, a resistor and two diodes, with an obvious restraint of the area occupation of the driving circuit 1 as a whole.

A driving circuit 1 is thus obtained being simple to be realized, reliable and with a reduced area occupation, particularly suitable to the applications of the ultrasonic probes with a high number of channels, in particular of the 3D type.

Obviously, a technician of the field, aiming at meeting incidental and specific needs, will bring several modifications to the above described driving circuit, all within the scope of protection of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A driving circuit, comprising:
  an output terminal configured to provide an output voltage; and
  a first portion coupled to a first voltage reference terminal and including:
    a first output transistor coupled between said first voltage reference terminal and said output terminal, the first output transistor having a control terminal;
    a first high voltage comparator coupled to said output terminal and to a first threshold voltage reference terminal, the first high voltage comparator being configured to provide an OFF signal in response to said output voltage reaching a first supply voltage value that depends on said first threshold voltage reference;
    a first start-up circuit configured to be controlled by a first setting signal, the first start-up circuit being configured to provide a first ON signal; and
    a first turning ON/OFF circuit having an input and an output, the input being coupled to said first start-up circuit by a first internal circuit node, and to said first high voltage comparator by a second internal circuit node, the output being coupled to the control terminal of said first output transistor, the first turning ON/OFF circuit being configured to receive the first ON and OFF signals and to switch off said first output transistor in response to the OFF signal, wherein said first high voltage comparator comprises a resistor and a Zener diode coupled, in parallel with one another, between a third internal circuit node and said first threshold voltage reference terminal.

2. A driving circuit according to claim 1, wherein said first high voltage comparator comprises:
  a comparator transistor coupled between said second internal circuit node and said first threshold voltage reference terminal and having a control terminal coupled to the third internal circuit node; and a diode coupled between the third internal circuit node and said output terminal, said diode being configured to provide the control terminal of the comparator transistor with a second ON signal based on a value of said output voltage at said output terminal.

3. A driving circuit according to claim 2, wherein said first start-up circuit comprises an input transistor coupled between said first internal circuit node and a second voltage reference terminal and having a control terminal configured to receive said first setting signal, said input transistor being configured to provide said first internal circuit node with said first ON signal.

4. A driving circuit according to claim 3, wherein said first start-up circuit further comprises a first resistor and a first diode coupled between said first voltage reference terminal and a third voltage reference terminal and being interconnected at said first internal circuit node.

5. A driving circuit, comprising:
an output terminal configured to provide an output voltage; and
a first portion coupled to a first voltage reference terminal and including:
a first output transistor coupled between said first voltage reference terminal and said output terminal, the first output transistor having a control terminal;
a first high voltage comparator coupled to said output terminal and to a first threshold voltage reference terminal, the first high voltage comparator being configured to provide an OFF signal in response to said output voltage reaching a first supply voltage value that depends on said first threshold voltage reference;
a first start-up circuit configured to be controlled by a first setting signal, the first start-up circuit being configured to provide a first ON signal; and
a first turning ON/OFF circuit having an input and an output, the input being coupled to said first start-up circuit by a first internal circuit node, and to said first high voltage comparator by a second internal circuit node, the output being coupled to the control terminal of said first output transistor, the first turning ON/OFF circuit being configured to receive the first ON and OFF signals and to switch off said first output transistor in response to the OFF signal, wherein
said first high voltage comparator comprises:
a comparator transistor coupled between said second internal circuit node and said first threshold voltage reference terminal and having a control terminal coupled to a third internal circuit node; and
a diode coupled between the third internal circuit node and said output terminal, said diode being configured to provide the control terminal of the comparator transistor with a second ON signal based on a value of said output voltage at said output terminal;
said first start-up circuit comprises
an input transistor coupled between said first internal circuit node and a second voltage reference terminal and having a control terminal configured to receive said first setting signal, said input transistor being configured to provide said first internal circuit node with said first ON signal; and
a first resistor and a first diode coupled between said first voltage reference terminal and a third voltage reference terminal and being interconnected at said first internal circuit node; and said first turning ON/OFF circuit comprises:
a flip-flop coupled between said first voltage reference terminal and said third voltage reference terminal and having a first input coupled to said first internal circuit node, a second input coupled to said second internal circuit node, and an output; and
a buffer coupled between said first voltage reference terminal and said third voltage reference terminal, said buffer having an input coupled to the output of the flip-flop and an output coupled to said control terminal of said first output transistor, the buffer being configured to provide a control signal to the control terminal of the first output transistor.

6. A driving circuit according to claim 5, wherein said first turning ON/OFF circuit further comprises a second resistor and a second diode coupled between said first voltage reference terminal and said third voltage reference terminal and being interconnected at said second internal circuit node, the second resistor and second diode being configured to provide said OFF signal.

7. A driving circuit according to claim 1, further comprising a voltage supply configured to provide to said first threshold voltage reference terminal a threshold voltage reference between a first and a second supply voltage value desired for said output voltage.

8. A driving circuit according to claim 1, comprising a second portion coupled to a second voltage reference terminal and including:
a second output transistor coupled between said output terminal and said second voltage reference terminal; and
a second high voltage comparator coupled to said output terminal and to a second threshold voltage reference terminal;
a second start-up circuit configured to be controlled by a second setting signal; and
a second turning ON/OFF circuit having an input and an output, the input being coupled to said first start-up circuit, and to said first high voltage comparator, the output being coupled to the control terminal of said second output transistor.

9. A driving circuit according to claim 8, wherein said first output transistor is a high voltage P-channel MOS transistor and said second output transistor is a high voltage N-channel MOS transistor.

10. A method, comprising:
generating a supply voltage value at an output terminal, the generating including:
providing a voltage reference to a first conduction terminal of an output transistor having a second conduction terminal coupled to the output terminal;
increasing an output voltage level of said output terminal by turning on said output transistor;
cutting off said increasing said output voltage level in response to detecting that the output voltage level has reached said supply voltage value, wherein the cutting off is started by switching a comparator having inputs respectively coupled to said output terminal and to a threshold voltage reference that is independent from said voltage reference, the comparator including:
a comparator transistor; and
a resistor and a Zener diode coupled, in parallel with one another, between a control terminal of the comparator transistor and said first threshold voltage reference.

11. A method according to claim 10, wherein said threshold voltage reference is chosen to cause said comparator transistor to be turned on in response to said output voltage level reaching said supply voltage value.

12. A method according to claim 11, wherein said threshold voltage reference is correlated to said supply voltage value.

13. A method according to claim 12, comprising varying said threshold voltage reference between a first and a second desired supply voltage value.

14. A method according to claim 10, wherein said output terminal is coupled to an ultrasonic transducer configured to generate ultrasound pulses.

15. A method according to claim 14 wherein said ultrasonic pulses have at least first and second widths.

16. A system, comprising:
a transducer; and
a driving circuit including:
an output terminal coupled to the transducer and configured to provide the transducer with an output voltage; and
a first portion coupled to a first voltage reference terminal and including:
a first output transistor coupled between said first voltage reference terminal and said output terminal, the first output transistor having a control terminal;
a first high voltage comparator coupled to said output terminal and to a first threshold voltage reference terminal, the first high voltage comparator being configured to provide an OFF signal in response to said output voltage reaching a first supply voltage value that depends on said first threshold voltage reference;
a first start-up circuit configured to be controlled by a first setting signal, the first start-up circuit being configured to provide an ON signal; and
a first turning ON/OFF circuit having an input and an output, the input being coupled to said first start-up circuit by a first internal circuit node, and to said first high voltage comparator by a second internal circuit node, the output being coupled to the control terminal of said first output transistor, the first turning ON/OFF circuit being configured to receive the ON and OFF signals and to switch off said first output transistor in response to the OFF signal, wherein the high voltage comparator includes:
a comparator transistor coupled between said second internal circuit node and said first threshold voltage reference terminal; and
a resistor and a Zener diode coupled in parallel between a control terminal of the comparator transistor and said first threshold voltage reference.

17. The system according to claim 16, wherein said first high voltage comparator comprises:
a diode coupled between the control terminal of the comparator transistor and said output terminal.

18. A system according to claim 16, wherein said first start-up circuit comprises an input transistor coupled between said first internal circuit node and a second voltage reference terminal and having a control terminal configured to receive said first setting signal, said input transistor being configured to provide said first internal circuit node with said first ON signal.

19. A system according to claim 18, wherein said first start-up circuit further comprises a first resistor and a first diode coupled between said first voltage reference terminal and a third voltage reference terminal and being interconnected at said first internal circuit node.

20. A system, comprising:
a transducer; and
a driving circuit including:
an output terminal coupled to the transducer and configured to provide the transducer with an output voltage; and
a first portion coupled to a first voltage reference terminal and including:
a first output transistor coupled between said first voltage reference terminal and said output terminal, the first output transistor having a control terminal;
a first high voltage comparator coupled to said output terminal and to a first threshold voltage reference terminal, the first high voltage comparator being configured to provide an OFF signal in response to said output voltage reaching a first supply voltage value that depends on said first threshold voltage reference;
a first start-up circuit configured to be controlled by a first setting signal, the first start-up circuit being configured to provide an ON signal; and
a first turning ON/OFF circuit having an input and an output, the input being coupled to said first start-up circuit by a first internal circuit node, and to said first high voltage comparator by a second internal circuit node, the output being coupled to the control terminal of said first output transistor, the first turning ON/OFF circuit being configured to receive the ON and OFF signals and to switch off said first output transistor in response to the OFF signal, wherein said first turning ON/OFF circuit comprises:
a flip-flop coupled between said first voltage reference terminal and a second voltage reference terminal and having a first input coupled to said first internal circuit node, a second input coupled to said second internal circuit node, and an output; and
a buffer coupled between said first voltage reference terminal and said second voltage reference terminal, said buffer having an input coupled to the output of the flip-flop and an output coupled to said control terminal of said first output transistor, the buffer being configured to provide a control signal to the control terminal of the first output transistor.

21. A system according to claim 20, wherein said first turning ON/OFF circuit further comprises a second resistor and a second diode coupled between said first voltage reference terminal and said second voltage reference terminal and being interconnected at said second internal circuit node, the second resistor and second diode being configured to provide said OFF signal.

22. A system according to claim 16, comprising a second portion coupled to a second voltage reference terminal and including:
a second output transistor coupled between said output terminal and said second voltage reference terminal; and
a second high voltage comparator coupled to said output terminal and to a second threshold voltage reference terminal;
a second start-up circuit a first start-up circuit configured to be controlled by a second setting signal; and
a second turning ON/OFF circuit having an input and an output, the input being coupled to said first start-up circuit, and to said first high voltage comparator, the output being coupled to the control terminal of said second output transistor.

23. A system according to claim 16, wherein said transducer is an ultrasonic transducer configured to generate ultrasonic pulses having first and second widths.

24. The system of claim 16, wherein said first turning ON/OFF circuit comprises:
- a flip-flop coupled between said first voltage reference terminal and a second voltage reference terminal and having a first input coupled to said first internal circuit node, a second input coupled to said second internal circuit node, and an output; and
- a buffer coupled between said first voltage reference terminal and said second voltage reference terminal, said buffer having an input coupled to the output of the flip-flop and an output coupled to said control terminal of said first output transistor, the buffer being configured to provide a control signal to the control terminal of the first output transistor.

25. The driving circuit of claim 4 wherein said first turning ON/OFF circuit comprises:
- a flip-flop coupled between said first voltage reference terminal and said third voltage reference terminal and having a first input coupled to said first internal circuit node, a second input coupled to said second internal circuit node, and an output; and
- a buffer coupled between said first voltage reference terminal and said third voltage reference terminal, said buffer having an input coupled to the output of the flip-flop and an output coupled to said control terminal of said first output transistor, the buffer being configured to provide a control signal to the control terminal of the first output transistor.

\* \* \* \* \*